(12) United States Patent
Chen

(10) Patent No.: US 6,639,202 B2
(45) Date of Patent: Oct. 28, 2003

(54) MULTI-RESOLUTION CHARGE-COUPLED DEVICE (CCD) SENSING APPARATUS

(75) Inventor: Michael Chen, Hsinchu (TW)

(73) Assignee: Avision Inc., Hsinchu (TW)

( * ) Notice: Subject to any disclaimer, the term of this patent is extended or adjusted under 35 U.S.C. 154(b) by 0 days.

(21) Appl. No.: 10/093,046

(22) Filed: Mar. 8, 2002

(65) Prior Publication Data

US 2002/0134915 A1 Sep. 26, 2002

(30) Foreign Application Priority Data

Mar. 23, 2001 (TW) ........................................ 90107009 A

(51) Int. Cl.$^7$ ............................................... H01L 27/00
(52) U.S. Cl. ........................ 250/208.1; 348/294; 377/63
(58) Field of Search ........................ 250/208.1, 214 SW, 250/214 R; 348/294, 298, 307, 311, 316; 377/63, 64, 60, 57

(56) References Cited

U.S. PATENT DOCUMENTS

| 4,918,506 A | * | 4/1990 | Dyck .......................... 257/234 |
| 5,262,871 A | * | 11/1993 | Wilder et al. ............... 348/307 |
| 5,874,993 A | * | 2/1999 | Ciccarelli et al. ........... 348/294 |

* cited by examiner

*Primary Examiner*—Kevin Pyo
*Assistant Examiner*—Seung C. Sohn
(74) *Attorney, Agent, or Firm*—Rabin & Berdo, P.C.

(57) ABSTRACT

A multi-resolution charge-coupled device (CCD) sensing apparatus is provided. The multi-resolution CCD sensing apparatus includes a photo sensor set, a shift gate, and several CCD shift registers. The shift gate includes several switches for receiving the charge signal from the photo sensor set and the switches. The switches output the charge signals to the corresponding CCD components with respect to different resolutions for the acquisition of the scanning image with different resolutions. It can achieve the economy of size, low cost by using the multi-resolution CCD sensing apparatus according to the invention and therefore speeds up scanning at low resolution.

16 Claims, 4 Drawing Sheets

MULTI-RESOLUTION CHARGE-COUPLED DEVICE (CCD) SENSING APPARATUS

This application incorporates by reference of Taiwan application Serial No. 90107009, filed Mar. 23, 2001.

BACKGROUND OF THE INVENTION

1. Field of the Invention

The invention relates in general to a multi-resolution charge-coupled device (CCD) sensing apparatus, and more particularly to a multi-resolution charge-coupled device (CCD) sensing apparatus applied to the CCD module and the CIS (Contact Image Sensor) module.

2. Description of the Related Art

In recent years, the scanner has been widely used. The user requires choosing from scanning modes of different resolutions for scanning in accordance with the property of the document to be scanned. Conventionally, there are several ways for setting the resolution, which might be accomplished by using either software or hardware. The way by using hardware is usually direct and fast.

The scanning procedures of the scanner with the CCD module are stated as follows. The carriage in the scanner has an illumination source. After the illumination source produces the light, the light is reflected by the document to be scanned and directed back to the carriage. The light signal is processed by the optical components, such as the mirrors and lenses, and received by the CCD module. The CCD module senses the magnitude of light signal and then generates corresponding scanning image data.

Referring to FIG. 1, a CCD module using a conventional charge-coupled device (CCD) sensing device is shown. The CCD module 100 includes a CCD sensing device 102, a control circuit 104 and an output capacitor C. The CCD sensing device 102 mainly includes a photo sensor set 106, shift gate 108, and CCD shift register 110. The CCD sensing device 102 with a resolution of 1200 dpi (dots per inch) is taken for example. The photo sensor set 106 includes 1200 photo sensing components D1~D1200 for converting the light signals into the charge signals S1~S1200. The photo sensing components maybe photo diodes. The shift gate 108 is used for controlling the transmission of the charge signals S1~S1200. When the photo sensing components D1~D1200 are exposed to light for a predetermined period of time, the photo sensing components D1~D1200 generate enough amount of charges, and then the shift gate 108 is open so that the charge signals S1~S1200 are sent to the CCD components E1~E1200 in the CCD shift register 110. Subsequently, the charge signals S1~S1200 stored in the CCD components E1~E1200 are serially outputted. The control circuit 104 is used for serially storing the charge signals, which are outputted due to the control of the CCD shift register 110, in the capacitor C to acquire the analog output signal Out. The output signal Out is processed by a next stage circuit (not shown) and the scanning image data are then acquired.

However, using different scanning modes of different resolutions for a user is necessary. For example, the scanning mode of high-resolution for scanning is required if the document to be scanned is a high color image. If the document to be scanned is text, it simply requires the scanning mode of low-resolution for scanning. In FIG. 1, the CCD sensing device 102 is a high-resolution sensing device, some properties of the CCD sensing device 102 has to be discarded when it is used for scanning at a low resolution.

As shown in FIG. 1, the CCD sensing device 102 with a high resolution is used for scanning at a low resolution of 600 dpi and the operation is described as follows: after the photo sensing components D1~D1200 are exposed to light, the charge signals S1~S1200 are stored in the CCD components E1~E1200. When the charge signals S1~S1200 are outputted, the control circuit 104 will store 600 charge signals, such as S2, S4, S6 . . . S1200, in the capacitor C in order to acquire the scanning image data of 600 dpi. Although the scanning image data are of low resolution, the time for shifting out the electric charges stored in the CCD components to the capacitor C is still the same as before and does not decrease any. Therefore, for the conventional CCD sensing device 102, scanning at a low resolution does not enhance the scanning speed and takes the same time with scanning at a high resolution.

The chips for the CCD sensing device with different resolutions have been widely used in the marketplace. To solve the above-mentioned problem, the CCD module having multiple CCD sensing devices with several different resolutions becomes available in the market.

Referring to FIG. 2, the conventional CCD module having multiple CCD sensing devices is shown. The CCD module 200 having three CCD sensing devices is an example for further illustration. The CCD module 200 has a CCD sensing device 202a with a resolution of 1200 dpi, a CCD sensing device 202b with a resolution of 600 dpi, and a CCD sensing device 202c with a resolution of 300 dpi. The CCD sensing devices 202a, 202b, and 202c have 1200 photo sensing components Da1~Da1200, 600 photo sensing components Db1~Db600, and 300 photo sensing components Dc1~Dc300 respectively. The CCD shift registers 210a, 210b, and 210c in the CCD sensing devices 202a, 202b, and 202c are respectively controlled by the pulse signals CK1, CK2, and CK3 and have 1200 CCD components Ea1~Ea1200, 600 CCD components Eb1~Eb600, and 300 CCD components Ec1~Ec300 respectively. The shift gates 208a, 208b, and 208c respectively control the transmission of the charge signals of the CCD sensing devices 202a, 202b, and 202c.

When the user chooses different scanning modes of different resolutions for scanning, the control circuit 204 will choose the outputs of the corresponding CCD sensing devices 202a, 202b, and 202c and send them to the capacitor C. That is to say, while scanning, the photo sensor sets 206a, 206b, and 206c are simultaneously exposed to light and store the charge signals in the CCD shift registers 210a, 210b, and 210c. When choosing the scanning mode of 1200 dpi, the control circuit 204 chooses the output of the CCD shift registers 210b or 210c. Since the CCD components of the CCD shift registers 210b and 210c are both far less than that of CCD shift registers 210a, the time to shift out the stored charges is far less in the CCD components Eb1~Eb600 or Ec1~Ec300 than in the CCD components Ea1~Ea1200. Therefore, using the CCD module in FIG. 2 while scanning at a low resolution will enhance the scanning speed.

Even so, using the CCD module 200 in FIG. 2 will confront the following disadvantageous situations. The conventional CCD module 200 uses the chip consisting of three juxtaposed CCD sensing devices with different resolutions. Failure to precisely focus might be caused during exposure to light. The photo sensor sets 206a, 206b, and 206c are parallel with one another and simultaneously receive the exposures of the light signals from the same optical components. If the optical components are set to focus on the photo sensor set 206a, scanning at a low resolution might cause failure to precisely focus and the scanning quality might be seriously influenced. Besides, it is necessary to use three different CCD sensing devices belonging to three chips. The required size is very large and the cost is quite high.

SUMMARY OF THE INVENTION

It is therefore an object of the invention to provide a multi-resolution charge-coupled device (CCD) sensing apparatus, used for scanning at different resolutions. The multi-resolution CCD sensing apparatus along with a photo sensor set and several CCD shift registers achieve the economy in size, low cost, and high yield rate. It speeds the scanning at a low resolution without causing failure to focus and therefore enhances the image scanning quality.

The invention achieves the above-identified objects by providing a multi-resolution charge-coupled device (CCD) sensing apparatus, comprising a photo sensor set, a shift gate, and at least one first CCD shift register and one second CCD shift register. The photo sensor set includes several photo sensing components for receiving light signals and generating a plurality of corresponding charge signals accordingly. The shift gate includes several switches for receiving the charge signals from the photo sensing components. The first CCD shift register includes M CCD components while the second CCD shift register includes N CCD components. The M CCD components are coupled with parts of the switches and the N CCD components are coupled with parts of the switches, wherein M and N are positive integers and M is larger than N, value M corresponds to scanning at a first resolution, and the value N corresponds to scanning at a second resolution. The switches selectively output the charge signals to the M CCD components while scanning at the first resolution, and the switches selectively output the charge signals to the N CCD components while scanning at the second resolution.

Other objects, features, and advantages of the invention will become apparent from the following detailed description of the preferred but non-limiting embodiments. The following description is made with reference to the accompanying drawings.

DETAILED DESCRIPTION OF THE INVENTION

The multi-resolution charge-coupled device (CCD) sensing apparatus according to the invention along with a photo sensor set and several CCD shift registers achieve the object of multi-resolution scanning. The photo sensor set and several CCD shift registers are formed on the same chip. The multi-resolution CCD sensing apparatus comprises a photo sensor set, a shift gate, and at least one first CCD shift register and one second CCD shift register. The photo sensor set includes several photo sensing components for receiving light signals and generating several corresponding charge signals accordingly. The shift gate has several switches for receiving the charge signals from the photo sensing components. The first CCD shift register includes M CCD components and the second CCD shift register includes N CCD components. Besides, the M CCD components are coupled with parts of the switches and the N CCD components are coupled with parts of the switches, wherein M and N are positive integers and M is larger than N, value M corresponds to scanning at a first resolution, and value N corresponds to scanning at a second resolution. While scanning at the first resolution, the switches selectively output the charge signals to the M CCD components. While scanning at the second resolution, the switches selectively output the charge signals to the N CCD components.

Moreover, the number of the CCD shift registers of the CCD sensing apparatus is not limited to 2 and may be greater than 2. The CCD sensing apparatus further comprising a third CCD shift register is taken as an example for illustration.

Embodiment 1

Figure 3:
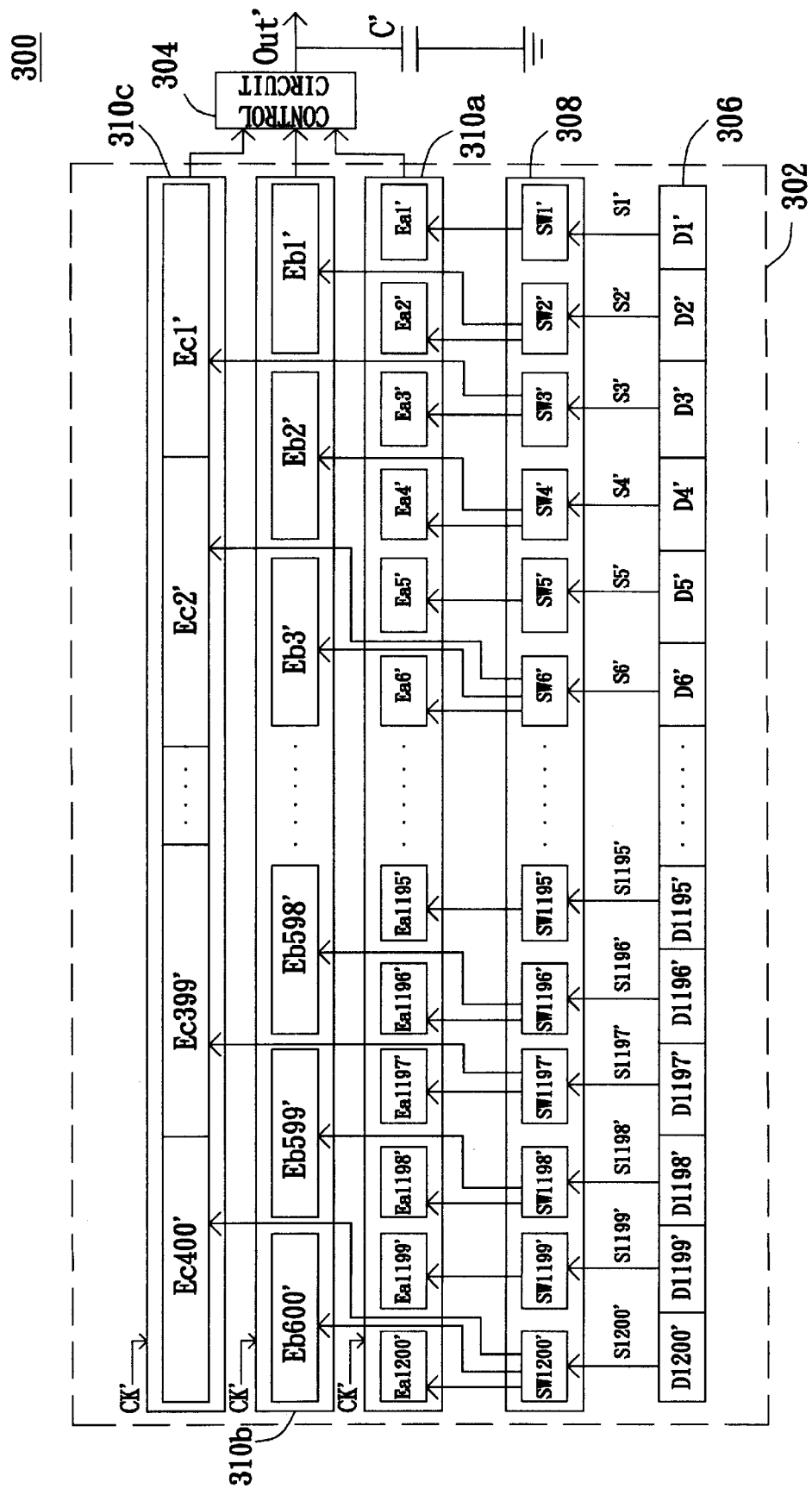
FIG. 3 is a block diagram of a CCD module using a multi-resolution CCD sensing apparatus according to the first embodiment of the invention.

Referring to FIG. 3, a block diagram of a CCD module using a multi-resolution CCD sensing apparatus according to the first embodiment of the invention is shown. The CCD module 300 using the multi-resolution CCD sensing apparatus 302 further includes a control circuit 304 and an output capacitor C'. The CCD sensing apparatus 302 mainly includes a photo sensor set 306, a shift gate 308, and three CCD shift registers 310a, 310b, and 310c. For example, the CCD module 200 has the CCD shift register 310a with a resolution of 1200 dpi (dots per inch), CCD sensing device 310b with a resolution of 600 dpi, and CCD sensing device 310c with a resolution of 400 dpi. The photo sensor set 306 includes photo sensing components D1'~D1200'. The CCD shift registers 310a, 310b, and 310c includes CCD components Ea1'~Ea1200', Eb1'~Eb600', and Ec1'~Ec400' respectively.

Besides, the shift gate 308 has several switches SW1'~SW1200', the number of the switches corresponds to the number of the photo sensing components in the photo sensor set 306, and the number may be 1200 for example. The switches SW'~SW1200' receive the charge signals from the photo sensing components D1'~D1200' correspondingly for outputting.

In order to achieve the object of multi-resolution scanning, the way of coupling the switches SW1'~SW1200' and CCD components Ea1'~Ea1200', Eb1'~Eb1200', and Ec1'~Ec1200' is stated in the following. The output terminals of the switches SW1'~SW1200' are coupled with the CCD components Ea1'~Ea1200' respectively. The output terminals of the switches SW2', SW4', SW6'~SW1200' with even numbers are coupled with the CCD components Eb1'~Eb600' respectively. The output terminals of the switches SW3', SW6', SW9'~SW1200' with a multiple of three are coupled with the CCD components Ec1'~Ec400'.

Therefore, while scanning at a high resolution of 1200 dpi, the switches SW1'~SW1200' send the charge signals S1'~S1200' from the photo sensing components D1'~D1200' to the CCD shift register 310a with a high resolution of 1200 dpi. While scanning at a resolution of 600 dpi, the switches SW2', SW4', SW6'~SW1200' send the charge signals S2', S4', S6'~S1200' from the photo sensing components D2', D4', D6'~D1200' to the CCD shift register 310b with a resolution of 600 dpi. While scanning at a resolution of 400 dpi, the switches SW3', SW6', SW9'~SW1200' sends the charge signals S3', S6', S9'~S1200' from the photo sensing components D3', D6', D9'~D1200' to the CCD shift register 310c with a resolution of 400 dpi. The control circuit 304 chooses the charge signals from the CCD shift register 310a, 310b, or 310c according to the scanning resolution and stores them in the output capacitor C' for the acquisition of the scanning image data.

For more details, while scanning at a high resolution of 1200 dpi, the photo sensing components D1'~D1200' are exposed to light for a predetermined period of time. The photo sensing components D1'~D1200' generate enough amount of charges and then several switches SW1'~SW1200' of the shift gate 308 are open so that the charge signals S1'~S1200' are sent to the CCD components Ea1'~Ea1200' in the CCD shift register 310a. Subsequently, the charge signals S1'~S1200' from the CCD components Ea1'~Ea1200' are serially outputted to the output capacitor C' to obtain the output signal Out and the scanning image data of 1200 dpi are then generated.

While scanning at a resolution of 600 dpi, the photo sensing components D1'~D1200' are similarly exposed to light for a predetermined period of time, the photo sensing components D1'~D1200' generate enough amount of charges and then several switches SW2', SW4', SW6'~SW1200' of the shift gate 308 are open so that the charge signals S2', S4', S6'~S1200' are sent to the CCD components Eb2', Eb4', Eb6'~E1200 in the CCD shift register 310b. Subsequently, the charge signals S2', S4', S6'~S1200' from the CCD components Eb1'~E600' are serially outputted to the output capacitor C' to obtain the output signal Out and the scanning image data of 600 dpi are then generated.

While scanning at a resolution of 400 dpi, the photo sensing components D1'~D1200' are similarly exposed to light for a predetermined period of time, the photo sensing components D1'~D1200' generate enough amount of charges and then several switches SW3', SW6', SW9'~SW1200' of the shift gate 308 are open so that the charge signals S3', S6', S9'~S1200' are sent to the CCD components Eb3', Eb6', Eb9'~Eb1200' in the CCD shift register 310c. Subsequently, the charge signal S3', S6', S9'~S1200' from the CCD components Eb1'~E400' are serially outputted to the output capacitor C' to obtain the output signal Out and the scanning image data of 400 dpi are then generated.

Therefore, while scanning at a resolution of 600 dpi, only the charge signals of 600 CCD components Eb1'~Eb600' in the CCD shift register 310b are required to be shifted out. The time for shifting out the charge signals is less at a low resolution of 600 dpi than at a high resolution of 1200 dpi. While scanning at a low resolution of 400 dpi, only the charge signals of 400 CCD components Ec1'~Ec400' in the CCD shift register 310c are required to be shifted out. The time for shifting out the charge signals is less at a low resolution of 400 dpi than at a resolution of 600 dpi. Hence, it speeds up scanning by using the multi-resolution CCD sensing apparatus according to the invention for scanning at a low resolution.

Besides, the multi-resolution CCD sensing apparatus according to the invention uses the same photo sensor set 306 no matter what the scanning resolution is and thus the optical components can keep focusing the light signal on the photo sensor set 306 without causing failure to focus and therefore enhances the image scanning quality.

Figure 1:
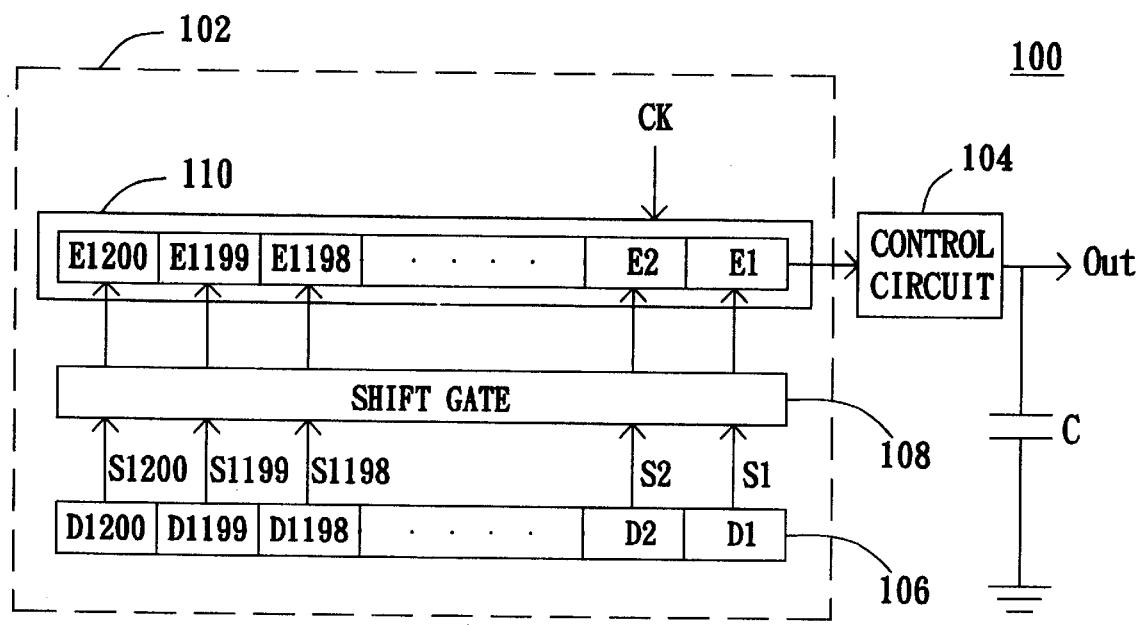
FIG. 1 illustrates a CCD module using a conventional charge-coupled device (CCD) sensing device.
Figure 2:
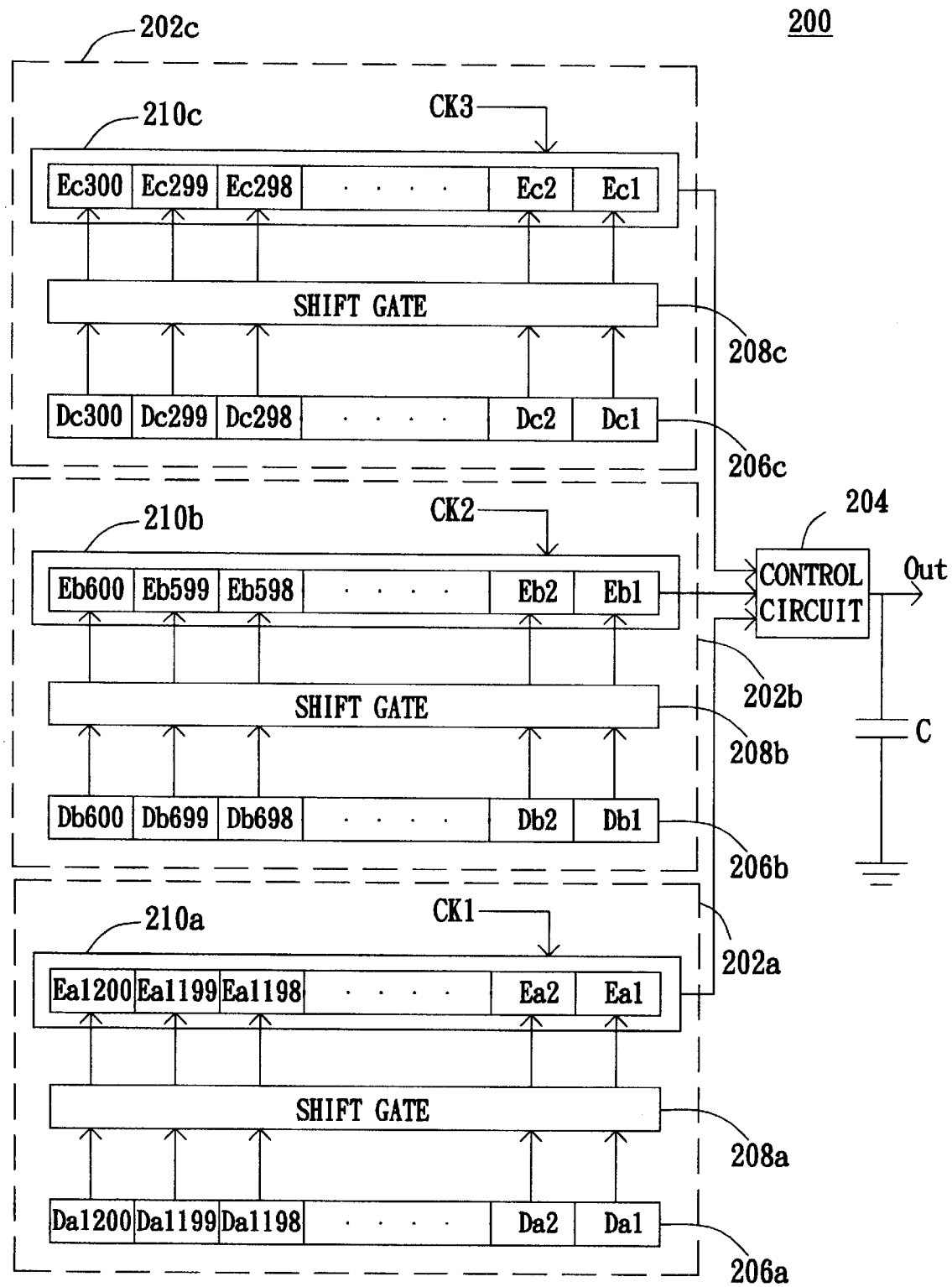
FIG. 2 illustrates a conventional CCD module having multiple CCD sensing devices.

Furthermore, the multi-resolution CCD sensing apparatus according to the invention simply using one photo sensor set requires fewer components than the conventional CCD sensing device of FIG.2 and therefore achieves the economy in size required by the chips and reduces the cost. As for the chip manufacture, it does not require additional mask due to the reduction of the chip size and the yield rate is thus raised.

The CCD components Ea1'~Ea1200' of the CCD shift registers 310a, the CCD components Eb1'~Eb600' of the CCD shift registers 310b, and the CCD components Ec1'~Ec400' of the CCD shift registers 310c can be of different component widths. The component width can be the electrode width of the CCD component. For example, the component widths of the CCD components Eb1'~Eb600' are twice as wide as those of the CCD components Ea1'~Ea1200' while the component widths of the CCD components Ec1'~Ec400' are triple those of the CCD components Ea1'~Ea1200'. The widths of CCD shift register 310a, 310b, and 310c are close in the configuration so that the shifting speed of the charge signals is not influenced while scanning at a low resolution.

The multi-resolution CCD sensing apparatus stated above is not only applied to the CCD module but also applied to the CIS (Contact Image Sensor) module. The main difference between the CIS module and the CCD module is that the CIS module directly contacts the underside of the glass for placing the document to be scanned and receives the light signal reflected by the document to be scanned. However, the CIS module still requires the sensing components for sensing the light signal, and the CCD shift registers for storing the charge signals. The multi-resolution CCD sensing apparatus according to the invention having sensing components and CCD shift registers therefore can be applied to the CIS module.

Moreover, the invention is not limited to include CCD shift registers with resolutions of 1200 dpi, 600 dpi, and 400 dpi and may include CCD shift registers with other resolutions according to the actual requirement.

Embodiment 2

In FIG. 3, each of the CCD components Ea1'~Ea1200', Eb1'~Eb600', and Ec1'~Ec400' is coupled with one of the corresponding switches SW1'~SW1200'. Each of the CCD components Eb1'~Eb600' and Ec1'~Ec400' of low resolutions can also be coupled with several switches at the same time.

Figure 4:
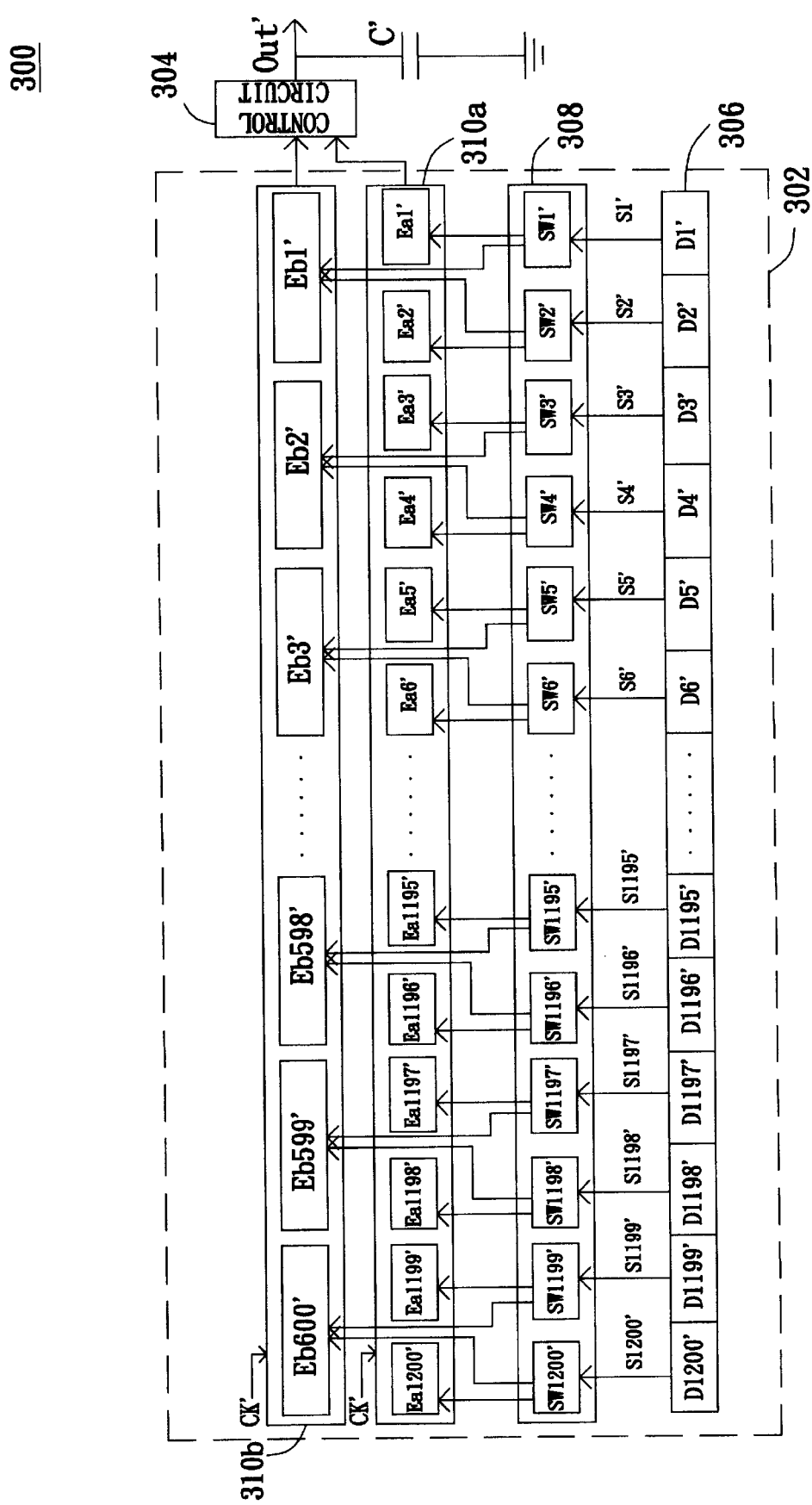
FIG. 4 is a block diagram of the CCD module using a multi-resolution CCD sensing apparatus according to the second embodiment of the invention.

Referring to FIG. 4, a block diagram of the CCD module using a multi-resolution CCD sensing apparatus according to a second embodiment of the invention is shown. The multi-resolution CCD sensing apparatus 302 includes the CCD shift registers 310a and 310b, for example, but is not limited thereto and can include more than two CCD shift registers. As shown in FIG. 4, each CCD component Ea' is coupled with one switch SW' in sequence and each CCD component Eb' is coupled with two switches in sequence. For instance, the CCD component Eb1' is coupled with SW1' and SW2', the CCD component Eb2' is coupled with SW3' and SW4', the CCD component Eb3' is coupled with SW5' and SW6', and so forth. Each CCD component Eb' can receive the charge signals from two photo sensing components. For instance, the CCD component Eb1' receives the charge signals S1' and S2' at the same time, the CCD component Eb2' receives the charge signals S3' and S4' at the same time, the CCD component Eb3' receives the charge signals S5' and S6' at the same time, and so forth.

If the multi-resolution sensing apparatus 302 further comprises the photo sensing components Ec1'~Ec400' (not shown), each of the photo sensing components Ec1'~Ec400' is coupled with three switches and receives three charge signals from the corresponding three photo sensing components. For instance, the CCD component Ec1' receives the charge signals S1', S2', and S3' at the same time, the CCD component Ec2' receives the charge signals S4', S5', and S6' at the same time, the CCD component Ec3' receives the charge signals S7', S8', and S9' at the same time, and so forth.

In the above-mentioned embodiments, the shift gate having several switches is used for the transmission of the charge signals. However, it can also be achieved to replace the switches by some other ways, such as modifying the IC layout for coupling the photo sensing components of the photo sensor set with the corresponding CCD components. As long as the photo sensing components coupled with the switches can be coupled with the corresponding CCD components, then the charge signals can be sent to at least parts of the CCD components of the chosen CCD shift register.

The multi-solution CCD sensing apparatus according to the above-mentioned embodiments of the invention is used for scanning at different resolutions. It can achieve the objects of the economy of size, low cost, and high yield rate. It also can speed up scanning at low resolution without causing failure to focus and therefore enhances the image scanning quality.

While scanning at a low resolution in the second embodiment, on the one hand, the capacity of the CCD component and the charge signal are enlarged so that the image data are able to have a larger signal-to-noise ratio and better the image quality. On the other hand, the signal sent to a CCD component is provided by two photo sensing components so that the exposure time is decreased and the scanning speed is increased.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A multi-resolution charge-coupled device (CCD) sensing apparatus, comprising:
    a photo sensor set having a plurality of photo sensing components for receiving a light signal and generating a plurality of corresponding charge signals accordingly;
    a shift gate having a plurality of switches for receiving the charge signals from the photo sensing components; and
    a first CCD shift register having M CCD components and a second CCD shift register having N CCD components, the M CCD components being coupled with at least parts of the switches and the N CCD components being coupled with at least parts of the switches, wherein M and N are positive integers and M is larger than N, value M corresponds to scanning at a first resolution, and the value N corresponds to scanning at a second resolution;
    wherein the switches selectively output the charge signals to the M CCD components while scanning at the first resolution, and the switches selectively output the charge signals to the N CCD components while scanning at the second resolution.

2. The apparatus according to claim 1, wherein the photo sensor set comprises M photo sensing components.

3. The apparatus according to claim 1, wherein the shift gate comprises M switches.

4. The apparatus according to claim 1, wherein the M CCD components of the first CCD shift register are serially coupled with M switches, and the N CCD components of the second CCD shift register are serially coupled with N switches.

5. The apparatus according to claim 1, wherein the M CCD components of the first CCD shift register are coupled with all of the switches, and the N CCD components of the second CCD shift register are coupled with all of the switches.

6. The apparatus according to claim 1, further comprising a third CCD shift register having P CCD components, and the P CCD components being coupled with P switches, wherein P is an integer and less than N and value P corresponds to the scanning at a third resolution.

7. The apparatus according to claim 1, further comprising a third CCD shift register having P CCD components, and the P CCD components being coupled with all of the switches, wherein P is an integer and less than N and value P corresponds to scanning at the third resolution.

8. The apparatus according to claim 1, wherein the CCD sensing apparatus is applied to a CCD module.

9. The apparatus according to claim 8, wherein the CCD module further comprises a control circuit and an output capacitor, the control circuit transmits the charge signals of the M CCD components of the first CCD shift registers to the output capacitor while scanning at the first resolution, switches selectively output the charge signals to the M CCD components while scanning at the first resolution, and the control circuit transmits the charge signals of the N CCD components of the second CCD shift registers to the output capacitor while scanning at the second resolution.

10. The apparatus according to claim 1, wherein the CCD sensing apparatus is applied to a Contact Image Sensor (CIS) module.

11. A multi-resolution charge-coupled device (CCD) sensing apparatus, comprising:
    a photo sensor set having a plurality of photo sensing components for receiving a light signal and generating a plurality of corresponding charge signals accordingly; and
    a first CCD shift register having M CCD components and a second CCD shift register having N CCD components, the M CCD components being coupled with at least parts of the photo sensing components and the N CCD components being coupled with at least parts of the photo sensing components, wherein M and N are positive integers and M is larger than N, value M corresponds to scanning at a first resolution, and value N corresponds to scanning at a second resolution;
    wherein the photo sensing components output the charge signals to the M CCD components while scanning at the first resolution, and the photo sensing components output the charge signals to the N CCD components while scanning at the second resolution.

12. The apparatus according to claim 11, wherein the photo sensor set comprises M photo sensing components.

13. The apparatus according to claim 11, wherein the M CCD components of the first CCD shift register are serially coupled with M photo sensing components, and the N CCD components of the second CCD shift register are serially coupled with N photo sensing components.

14. The apparatus according to claim 11, wherein the M CCD components of the first CCD shift register are coupled with all of the photo sensing components, and the N CCD components of the second CCD shift register are coupled with all of the photo sensing components.

15. The apparatus according to claim 11, further comprising a third CCD shift register having P CCD components, and the P CCD components being coupled with P photo sensing components, wherein P is an integer and less than N and value P corresponds to the scanning at a third resolution.

16. The apparatus according to claim 11, further comprising a third CCD shift register having P CCD components, and the P CCD components being coupled with all of the photo sensing components, wherein P is an integer and less than N and value P corresponds to scanning at the third resolution.

* * * * *